(12) United States Patent
Kuroki et al.

(10) Patent No.: US 8,743,166 B2
(45) Date of Patent: Jun. 3, 2014

(54) LIGHT-EMITTING DEVICE AND METHOD OF MANUFACTURING THE SAME

(71) Applicant: Oki Data Corporation, Tokyo (JP)

(72) Inventors: Eisuke Kuroki, Takasaki (JP); Takahito Suzuki, Takasaki (JP); Kenichi Tanigawa, Takasaki (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 13/748,675

(22) Filed: Jan. 24, 2013

(65) Prior Publication Data

US 2013/0193459 A1    Aug. 1, 2013

(30) Foreign Application Priority Data

Jan. 30, 2012  (JP) .................... 2012-016216

(51) Int. Cl.
*B41J 2/45* (2006.01)
*H01L 29/18* (2006.01)
*H01L 33/00* (2010.01)

(52) U.S. Cl.
USPC ............................. 347/238; 257/88

(58) Field of Classification Search
USPC .......... 347/224, 225, 238; 257/57, 59, 83, 84, 257/98, 100, 506, 88; 438/22, 24, 29
See application file for complete search history.

(56) References Cited

U.S. PATENT DOCUMENTS

| | | | |
|---|---|---|---|
| 7,164,155 B2 * | 1/2007 | Yamazaki et al. | 257/84 |
| 7,705,868 B2 * | 4/2010 | Masuda et al. | 347/238 |
| 2006/0099526 A1 * | 5/2006 | Yang | 430/58.5 |
| 2007/0025765 A1 * | 2/2007 | Akagawa et al. | 399/139 |

FOREIGN PATENT DOCUMENTS

| | | | | |
|---|---|---|---|---|
| JP | 2001-215369 A | | 8/2001 | |
| JP | 2009164242 A | * | 7/2009 | ............. H01L 33/00 |

* cited by examiner

*Primary Examiner* — Hai C Pham
(74) *Attorney, Agent, or Firm* — Marvin A. Motsenbocker; Mots Law, PLLC (57) ABSTRACT

A light-emitting device includes a substrate; a light-emitting element formed on the substrate; a seal member sealing the light-emitting element, the seal member formed of a transparent dry film resist laminated on the substrate with the light-emitting element interposed therebetween.

8 Claims, 12 Drawing Sheets

LIGHT-EMITTING DEVICE AND METHOD OF MANUFACTURING THE SAME

CROSS REFERENCE TO RELATED APPLICATIONS

This application claims priority based on 35 USC 119 from prior Japanese Patent Application No. 2012-016216 filed on Jan. 30, 2012, entitled "LIGHT-EMITTING DEVICE AND METHOD OF MANUFACTURING THE SAME", the entire contents of which are incorporated herein by reference.

BACKGROUND OF THE INVENTION

1. Field of the Invention

This disclosure relates to a light-emitting device including a sealed light-emitting element.

2. Description of Related Art

Conventionally, in a light-emitting device of such a kind, a chip is covered with a transparent resin or a resin having a fluorescent agent mixed therein, by the following generally-known methods. For example, in one method, a seal made of a resin is formed by use of a molding die or the like (see, for example, Japanese Patent Application No. 2001-215369; page 3 and FIG. 3), or in another method, a seal is formed by forming a damming portion around a light-emitting diode (called an LED below) and dispensing a sealer into the damming portion by potting using a dispenser.

SUMMARY OF THE INVENTION

However, these conventional techniques have problems in costs and manufacturing time because they either require initial costs and time for preparing the molding die or need to additionally form the resin-stopping structure for preventing the resin from flowing out. Further, with these methods, inclusion of air bubbles easily occurs, and also, precise alignment between the light-emitting element and the seal is difficult. To seal multiple minute areas on a single substrate, fine molds need to be produced, or the number and amount of dispensing needs to be precisely controlled.

An aspect of the invention is a light-emitting device including: a substrate; a light-emitting element formed on the substrate; a seal member sealing the light-emitting element, the seal member being formed of a transparent dry film resist laminated on the substrate with the light-emitting element interposed therebetween.

Another aspect of the invention is a method of manufacturing a light-emitting device. The method includes: laminating a dry film resist on a substrate on which a light-emitting element is formed, with the light-emitting element interposed between the dry film resist and the substrate; placing a photomask on the laminated dry film resist; exposing to light an area of the dry film resist excluding a portion covered with the photomask; and forming a pattern of a seal layer, made of dry film resist sealing the light emitting element, by eluting the unexposed portion covered with the photomask.

According to the above aspects of the invention, the invention can provide a light-emitting device including a seal member which achieves an easy, precise positional alignment, can be formed in fine patterns, makes air bubbles unlikely to be generated, is manufactured easily, and can achieve a reduction in manufacture costs.

DETAILED DESCRIPTION OF EMBODIMENTS

Descriptions are provided hereinbelow for embodiments based on the drawings. In the respective drawings referenced herein, the same constituents are designated by the same reference numerals and duplicate explanation concerning the same constituents is omitted. All of the drawings are provided to illustrate the respective examples only.

Embodiment 1

Figure 1:
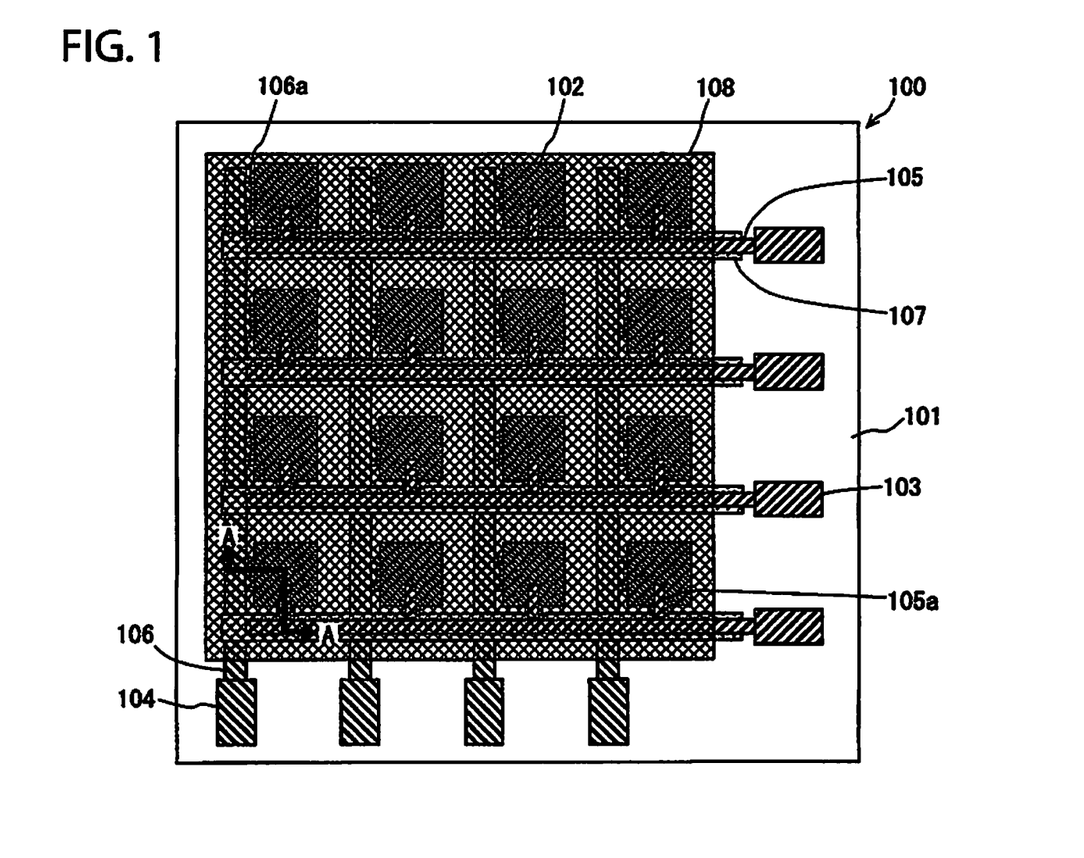
FIG. 1 is a plan view showing the configuration of a main part of a light-emitting device according to Embodiment 1 of the invention.
Figure 2:
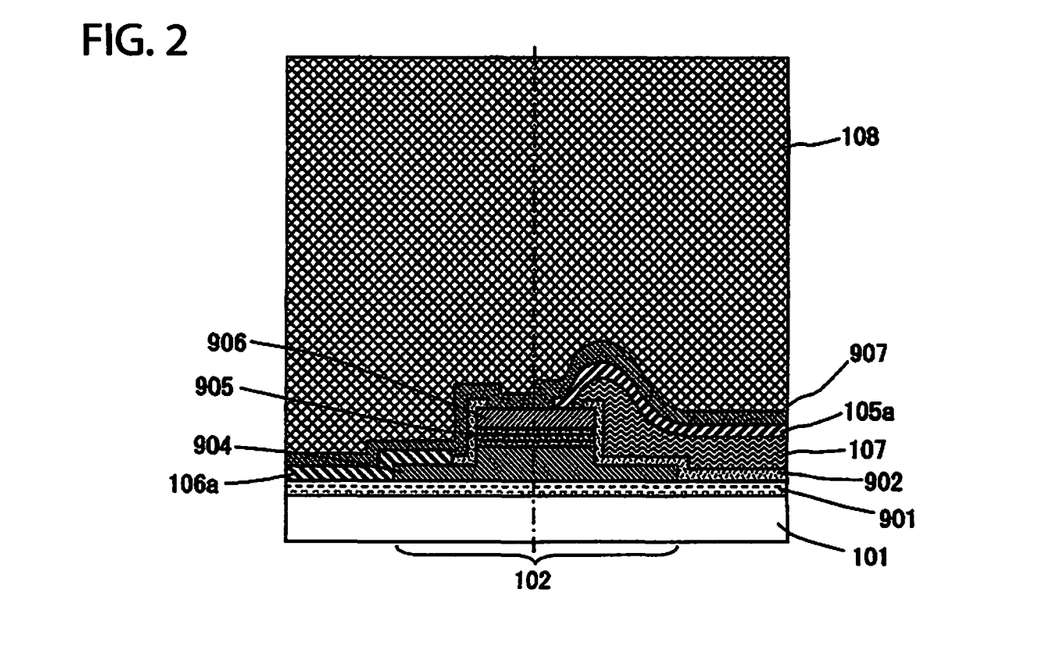
FIG. 2 is a sectional view taken along line A-A in FIG. 1.

FIG. 1 is a plan view showing the configuration of a main part of light-emitting device 100 according to Embodiment 1 of the invention, and FIG. 2 is a sectional view taken along line A-A in FIG. 1.

As shown in FIG. 1, light-emitting device 100 has substrate 101 as the lowermost layer, and multiple LEDs 102 (light-emitting elements) are arranged on substrate 101 in a grid of m columns and k rows. Herein, substrate 101 is formed of, for example, a semiconductor substrate made of Si, GaAs, GaP, InP, GaN, ZnO, or the like; a ceramic substrate made of AlN, $Al_2O_3$, or the like; a glass substrate; a glass epoxy substrate; a metallic substrate made of Cu, Al, or the like; or a plastic substrate, or the like. Further, the number of LEDs 102 arranged (m×k) herein is m=4 and k=4, as an example.

Anode wires 105, the number of which are equal to the number of rows (k=4 in the Embodiment 1 example of FIG. 1) of LEDs 102 of light-emitting device 100, are arranged along the respective rows and parallel to each other. Cathode wires 106, the number of which are equal to the number of columns (m=4 in the Embodiment 1 example of FIG. 1) of LEDs 102 of light-emitting device 100, are arranged along the respective columns and parallel to each other. Interlayer insulation film 107, made for example of polyimide or the like, is formed under a layer having anode wires 105, and between that layer and a layer having cathode wires 106. Interlayer insulation film 107 prevents an electrical contact between anode wires 105 and cathode wires 106 at their intersection areas.

Anode pad 103 is placed at one end of each anode wire 105, and cathode pad 104 is placed at one end of each cathode wire 106. For example, wiring materials usable for these anode wires 105, cathode wires 106, anode pads 103, cathode pads 104, and the like include an Au-based metal such as Au, Ti/Pt/Au, Ti/Au, AuGeNi/Au, or AuGe/Ni/Au, or an Al-based metal such as Al, Ni/Al, Ni/AlNd, Ni/AlSiCu, or Ti/Al. Oxide-based transparent electrodes can also be used.

Seal layer 108 (the seal member) is formed on LEDs 102. In this embodiment, seal layer 108 has an area large enough to collectively cover all LEDs 102 on light-emitting device 100, and cover almost the entire surface of substrate 101, except for anode pads 103 and cathode pads 104.

FIG. 2 is a sectional view taken along line A-A in FIG. 1. As shown in FIG. 2, LEDs 102 are attached onto substrate 101 by an intermolecular force with flattening insulation film 901 interposed therebetween. For example, LEDs 102 have N-type semiconductor layer 904 attached to flattening insulation film 901, active layer 905 formed on N-type semiconductor layer 904, and P-type semiconductor layer 906 formed on active layer 905. N-type semiconductor layer 904 is electrically connected to contact terminal 106a extending from corresponding cathode wire 106, and P-type semiconductor layer 906 is electrically connected to contact terminal 105a extending from corresponding anode wire 105. Here, passivation film 907, made for example of SiN, $SiO_2$, $Al_2O_3$, or the like, is formed on the surfaces of the elements.

For example, this passivation film 907 has an area large enough to collectively cover all LEDs 102 on light-emitting device 100, and is formed on almost the entire surface of the substrate 101, except for anode pads 103 and cathode pads 104. Inorganic insulation film 902 is formed for protection in, for example, the step of forming cathode wires 106, and the inorganic insulation file is formed except for certain portions of N-type semiconductor layer 904 with which contact terminals 106a are to come into contact.

The sectional configuration described above is common to all LEDs 102, and these LEDs 102 are covered with seal layer 108, as described earlier. Seal layer 108 is formed using a transparent, photosensitive dry film resist. This dry film resist can be mainly made of, for example, an epoxy resin, an acrylic resin, a silicone resin, a polyimide resin, an amide-imide resin, or the like. A preferable material should be one having a high transmittance for light having the wavelength of an LED light source and being not likely to decrease in the transmittance for light having such a wavelength due to a lapse of time or an environmental change. Note that a dry film resist made of an epoxy resin is used as an example herein.

Figure 3:
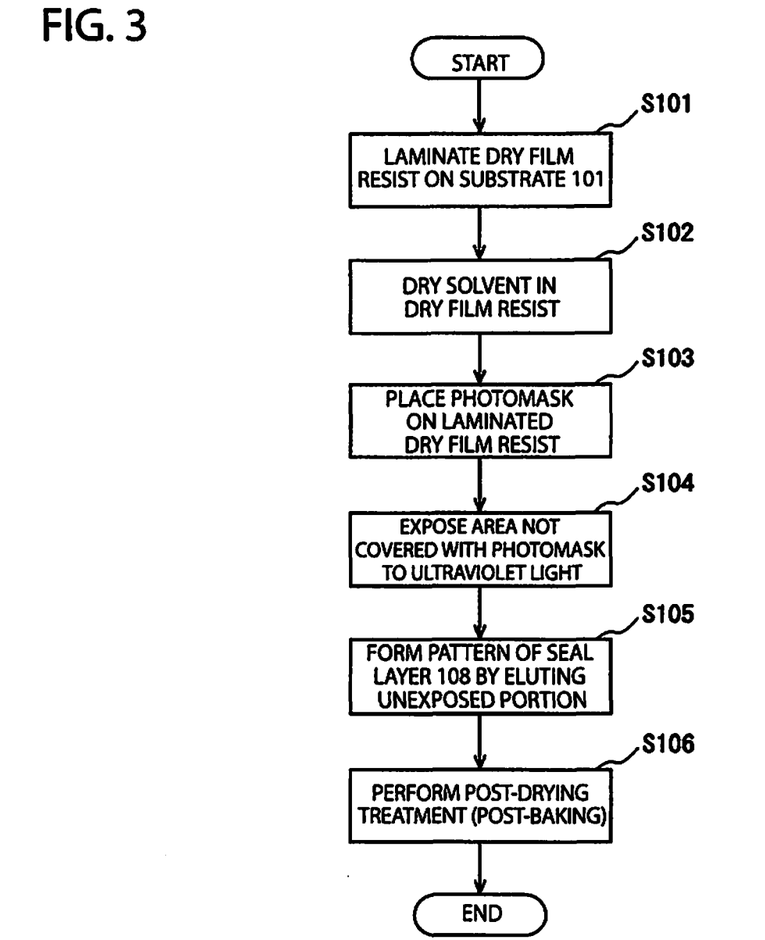
FIG. 3 is a flowchart showing an example of a step of forming a seal layer by lithography.

Seal layer 108 can be formed with high precision by photolithography. FIG. 3 is a flowchart showing an example of steps for forming seal layer 108 by photolithography. A method of forming seal layer 108 is described by referring to this flowchart.

By use of a laminator (an attachment device), a dry film resist is laminated on substrate 101 on which components such as LEDs 102, anode wires 105, and cathode wires 106 necessary for light-emitting device 100, except for seal layer 108, are formed (Step S101). Then, a solvent contained in the dry film resist is dried (prebaked) (Step S102). A photomask is placed on the dry film resist thus obtained, to specify an area to be exposed to light (Step S103). The area not covered by the photomask is exposed to ultraviolet light to cure the portion exposed to the light (Step S104). Then, the dry film resist is developed through elution of the unexposed portion with an alkali solution or solvent, and thus, seal layer 108 is formed (Step S105).

Herein, the photomask used in Step S103 is formed to allow the pattern of seal layer 108 to be large enough to collectively cover all LEDs 102 on light-emitting device 100 shown in FIG. 1, but not to cover anode pads 103 and cathode pads 104. When necessary, seal layer 108 may further be post-baked as a post-drying treatment (Step S106) to be cured further.

Here, the light exposure is carried out using, for example, an ultraviolet light exposure device, and only a portion of the dry film resist which is to be transferred as the pattern is exposed to light and is thereby photo-cured. The exposure device and exposure conditions are appropriately selected, and usable light sources include an ultrahigh-pressure mercury lamp, a high-pressure mercury lamp, a metal halide lamp, a far-ultraviolet lamp, and the like. When necessary, a baking step may be added after the light exposure to promote reaction of the photo-cured portion so that the photo-cured portion may be more reliably prevented from melting during the development.

In light-emitting device 100 configured as above, when a predetermined voltage is applied to anode pad 103 with cathode pad 104 grounded, a current flows to LED 102 having P-type semiconductor layer 906 electrically connected to anode pad 103 supplied with the voltage as well as N-type semiconductor layer 904 electrically connected to cathode pad 104 grounded. As a result, LED 102 emits light. Accordingly, light-emitting device 100 can be driven in a dot matrix manner when a desired LED 102 is caused to emit light through application of a voltage to corresponding anode pad 103 and grounding corresponding cathode pad 104 at the same time, and when the light emission is repeated among desired LEDs 102 sequentially.

To evaluate sealing materials, samples of the following dry film resists are formed. Specifically, a dry film resist made of an amide-imide resin (KI-1000 manufactured by Hitachi Chemical Co., Ltd.) and a dry film resist made of an epoxy resin (SU-8 manufactured by NIPPON KAYAKU Co., Ltd.) are laminated on glass wafers, respectively. Light exposure is performed until each of the resins is made sufficiently insoluble, and post-baking is carried out for one hour at temperature of 180° C. Then, the samples thus formed are tested and evaluated for temporal changes in their light transmittances under a predetermined environment to be described later.

Figure 4:
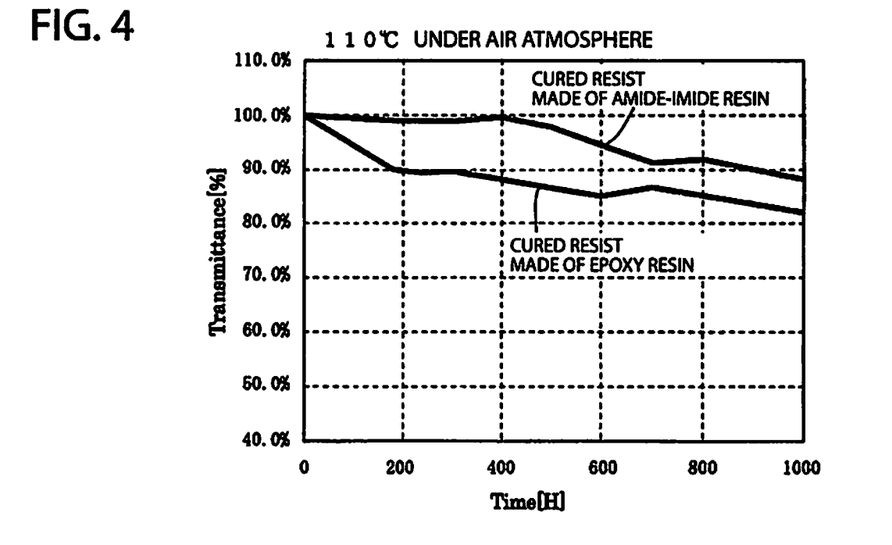
FIG. 4 is a graph of test results of samples observed for their temporal change in the transmittance for 450-nm-wavelength light under an air atmosphere at 110° C.
Figure 5:
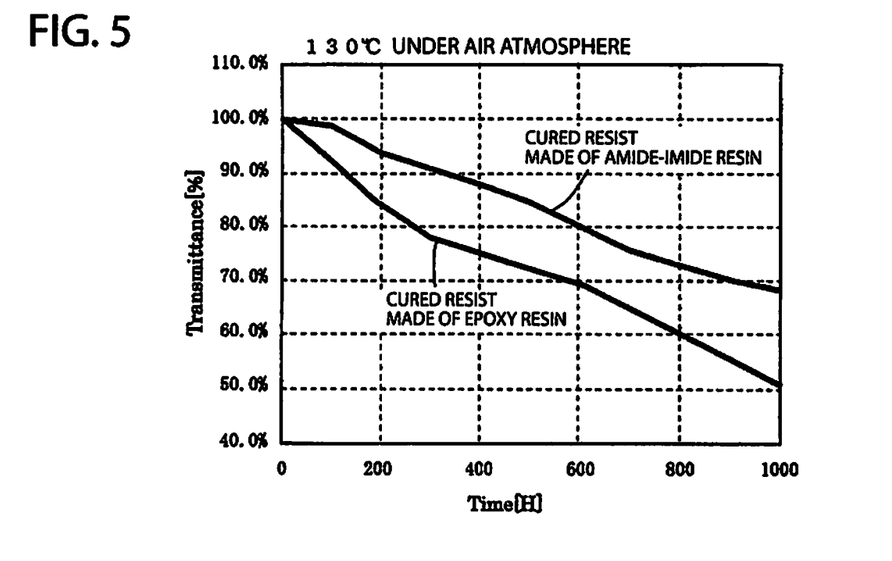
FIG. 5 is a graph of test results of samples observed for their temporal change in the transmittance for 450-nm-wavelength light under an air atmosphere at 130° C.

FIG. 4 shows test results of the samples observed for temporal changes in their transmittances for 450-nm-wavelength light under an air atmosphere at temperature of 110° C., with the initial transmittances of both samples used as references. FIG. 5 shows test results of the samples observed for temporal changes in their transmittances for 950-nm-wavelength light under an air atmosphere at temperature of 130° C. As is clear from the graphs in FIGS. 4 and 5, the amide-imide resin deteriorates less in transmittance with time than the epoxy resin does.

The test results are each inserted into an Arrhenius equation, $\ln(L)=A\times(1/T)+\ln(B)$ (where L is life, A and B are constants, and T is temperature). Life L and temperature T are determined by the results of measurements under 110° C. and 130° C., and thereby, constants A and B are found. For example, the life of each sample is reached when its transmittance is reduced to 70% of the initial transmittance.

Thereby, life L1 at a given temperature T1, or temperature T2 for a given life L2 is obtained. From the results of the 450-nm-wavelength tests and the Arrhenius equation, the life of the sample made of an amide-imide resin is 45,000 hours at 70° C., which is three times or more the life of the sample made of an epoxy resin at the same temperature, which is 13,000 hours. Accordingly, it can be said that a dry film resist made of an amide-imide resin is more preferable as a material for seal layer 108 than that made of an epoxy resin.

As described above, according to light-emitting device 100 of this embodiment, the following effects can be obtained: (1) being formed from a dry film resist having a uniform thickness, seal layer 108 is easily formed with a uniform thickness on LEDs 102 formed in the surface of light-emitting device 100, (2) generation of air bubbles at the time of attachment is easily prevented because the dry film resist is used as seal layer 108, (3) the manufacturing steps can be simplified because the sealing is performed with the dry film resist, (4) the sealing pattern can be positioned with improved precision because seal layer 108 is formed by patterning using a photolithography process, and (5) patterning of a minute shape on the order of microns can be supported because seal layer 108 is formed by patterning using a photolithography process.

Embodiment 2

Figure 6:
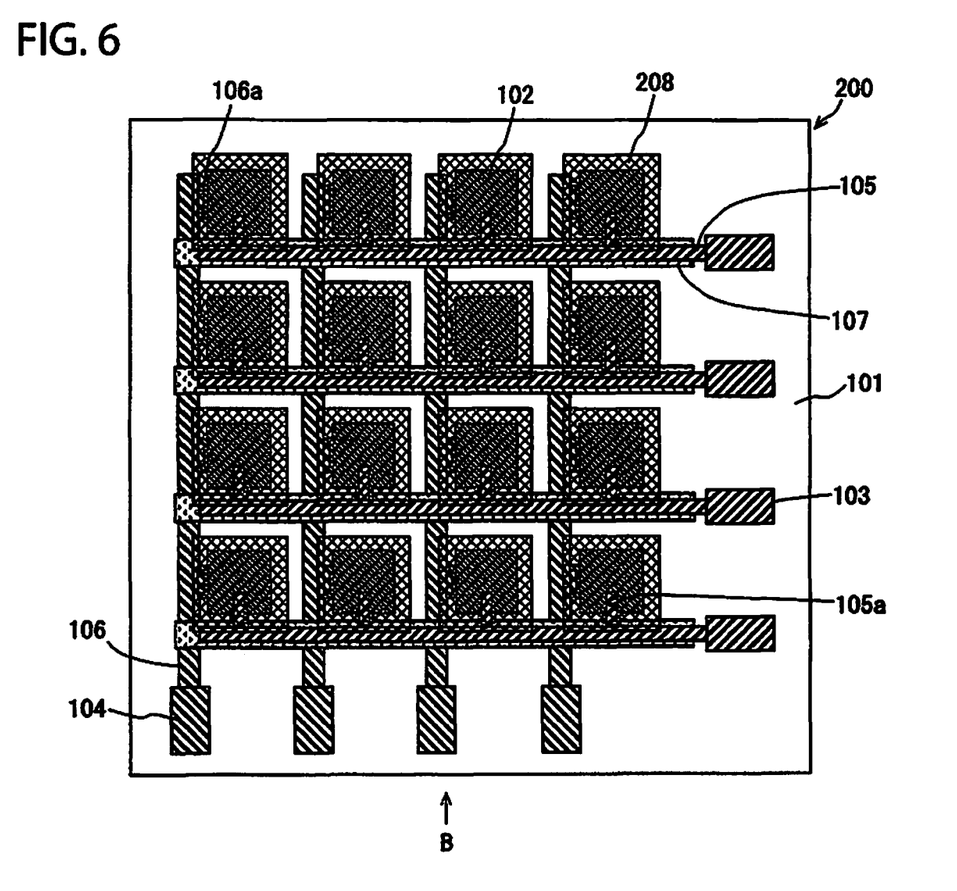
FIG. 6 is a plan view showing the configuration of a main part of a light-emitting device according to Embodiment 2 of the invention.
Figure 7:
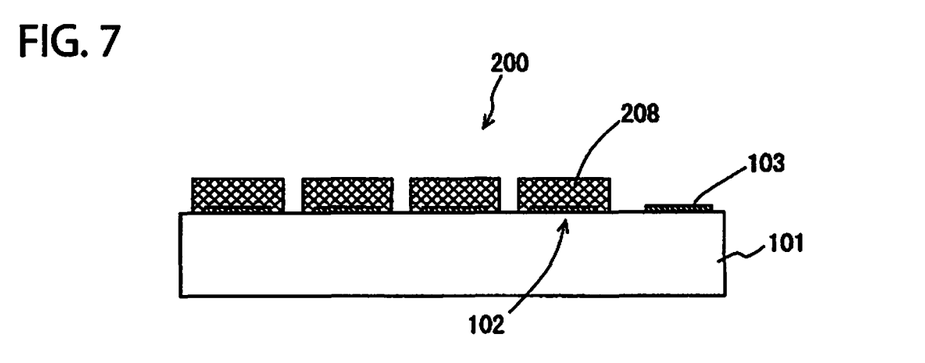
FIG. 7 is a side view schematically showing the main part of the light-emitting device according to Embodiment 2 in the direction of arrow B in FIG. 6.

FIG. 6 is a plan view showing the configuration of a main part of light-emitting device 200 according to Embodiment 2 of the invention, and FIG. 7 is a side view schematically showing the main part in the direction of arrow B in FIG. 6.

The main difference between light-emitting device 200 and light-emitting device 100 of Embodiment 1 shown in FIG. 1 is the pattern shape of seal layer 208. Accordingly, portions which are common between light-emitting device 200 and light-emitting device 100 of Embodiment 1 (FIG. 1) are denoted by the same reference numerals, or are neither shown in the drawings of FIGS. 6-7 nor described herein, in order to focus on the difference between them.

In light-emitting device 200 of Embodiment 2, substrate 101 on which components, such as LEDs 102, anode wires 105, and cathode wires 106, necessary for light emitting device 200, except for seal layer 208, is completely the same as that described in Embodiment 1 described above. However, seal layer 208 of Embodiment 2 is different from seal layer 108 of Embodiment 1 (FIG. 1) in that seal layer 208 for covering LEDs 102 is formed separately for each LED 102.

More specifically, the photomask used in Step S103 of the process for forming seal layer 208 shown in FIG. 3 is so formed as to allow seal layer 208 to cover each LED 102 on light-emitting device 200 individually, as shown in FIG. 6. Other formation steps are as described in Embodiment 1 with reference to the flowchart in FIG. 3, and are therefore not described here.

As described, seal layer 208 is formed by processing a dry film resist by photolithography. Accordingly, regardless of whether a chip has only one LED 102 or multiple LEDs 102, seal layer 208 can be formed for each LED 102 from a single dry film resist. Further, even in a case where multiple pieces of seal layer 208 are to be formed in various shapes in the chip, they can be formed collectively from a single dry film resist using a pattern appropriately set.

Here, a description is given of the advantage of light-emitting device 200 of Embodiment 2 through a comparison to light-emitting device 100 of Embodiment 1.

When seal layer 108 is formed as a single layer on substrate 101 over a large area as in light-emitting device 100 shown in FIG. 1 and is cured through a thermal treatment, a strong tension stress toward the center of seal layer 108 is generated. This stress affects LEDs 102 and substrate 101 in contact with seal layer 108, and causes a strong warpage of substrate 101, which may cause problems that includes a difficulty in attaching the substrate 101 to a manufacturing machine used in a later manufacturing step, film and wiring peeling on light-emitting device 100, wiring peeling on LEDs 102, and further, the generation of a gap between seal layer 108 and LEDs 102.

On the other hand, in light-emitting device 200 of this embodiment, seal layer 208 is formed separately for each LED 102 as shown in FIG. 6. Accordingly, stress applied to the entire light-emitting device 200 is dispersed, and thus a stress applied to light-emitting device 200 is reduced. Consequently, the warpage and operation trouble described above can be mitigated.

Light generated by LEDs 102 is emitted in every direction, and is emitted to the air through the interface between seal layer 208 and the air. Accordingly, compared to seal layer 108 of Embodiment 1 (FIG. 1), the interface between seal layer 208 (FIG. 6) and the air is large around LEDs 102, and therefore the amount of light emitted to the air from around LEDs 102 increases.

As described above, in addition to the effects (1) to (5) as listed previously that are obtained by Embodiment 1, light-emitting device 200 of this embodiment can offer the following effects: (6) warpage of substrate 101, wiring peeling, film peeling, generation of a gap between seal layer 208 and LEDs 102, and the like can be mitigated by lessening a stress acting on light-emitting device 200 and LEDs 102, (7) multiple divided pieces of seal layer 208 can be formed collectively in light-emitting device 200, (8) multiple divided pieces of seal layer 208 can be formed collectively even when the pieces are designed in various shapes, and (9) the amount of light emitted to the air from around LEDs 102 can be increased.

Embodiment 3

Figure 8:
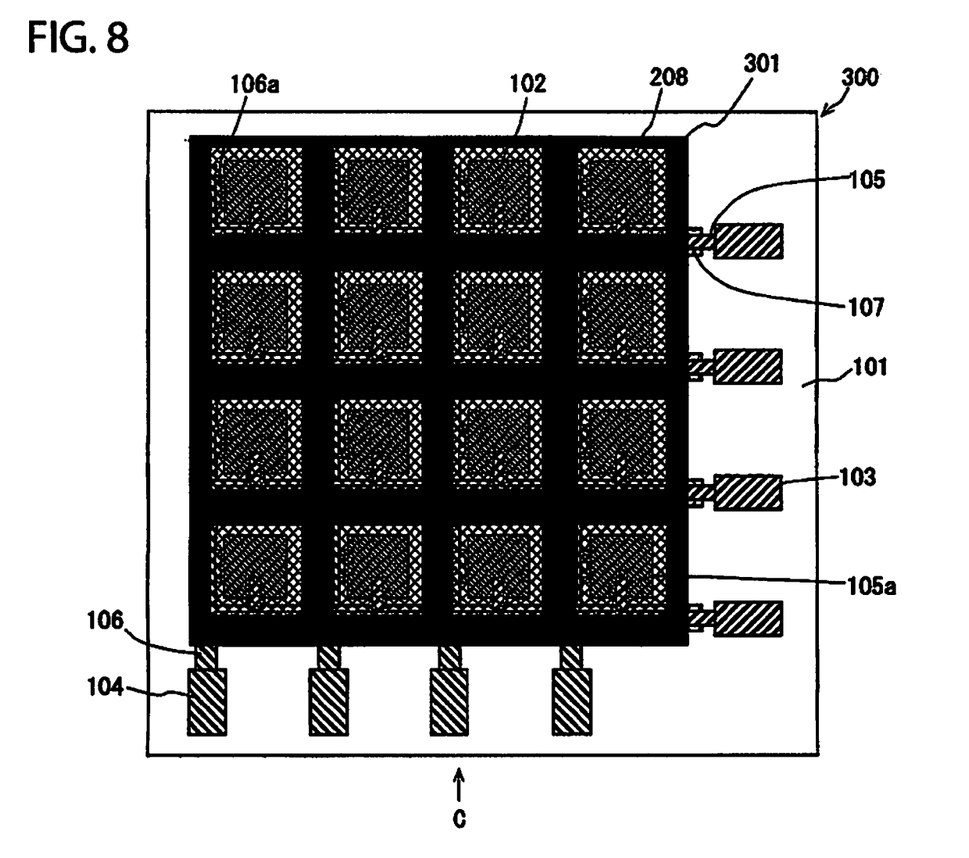
FIG. 8 is a plan view showing the configuration of a main part of a light-emitting device according to Embodiment 3 of the invention.
Figure 9:
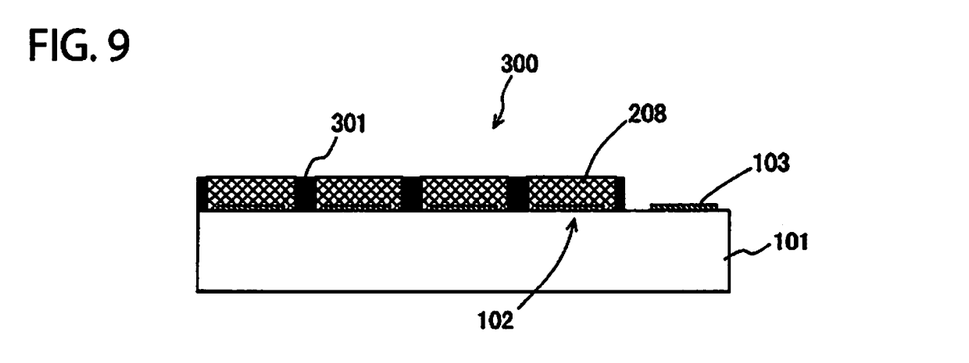
FIG. 9 is a side view schematically showing the main part of the light-emitting device according to Embodiment 3 in the direction of arrow C in FIG. 8.

FIG. 8 is a plan view showing the configuration of a main part of light-emitting device 300 according to Embodiment 3 of the invention, and FIG. 9 is a side view schematically showing the main part in the direction of arrow C in FIG. 8.

The main difference between light-emitting device 300 and light-emitting device 200 of Embodiment 2 shown in FIG. 6 is that black resist 301 is provided in spaces between adjacent ones of seal layers 208. Accordingly, portions which are common between light-emitting device 300 and light-emitting device 200 of Embodiment 2 (FIG. 6) are denoted by the same reference numerals, or are neither shown in the drawings of FIGS. 8-9 nor described herein, in order to focus on the difference between them.

In this embodiment, as shown in FIGS. 8 and 9, black resist 301 is formed around seal layers 208 and in the spaces between seal layers 208 formed away from each other. For example, black resist 301 is formed as follows. First, by spin coating, screen printing, dispensing, or the like, the spaces are filled with a resin in which a black colorant, such as carbon black or titanium black, is dispersed in an acrylic resin, an epoxy resin, or the like. Then, through a photolithography process, the resin is patterned to form a pattern in which the spaces between seal layers 208 are filled, as shown in FIGS. 8 and 9. Then, light-emitting device 300 thus sealed is cured by a thermal treatment.

According to light-emitting device 300 having the above configuration, light generated by each LED 102 and emitted through the side surface of seal layer 208 is absorbed by black resist 301. Consequently, light emitted laterally by light-emitting device 300 is reduced.

As described, in addition to the effects (1) to (9) obtained by Embodiment 2, light-emitting device 300 of this embodiment can offer the following effect: (10) because black resist 301 absorbs light emitted through the side surface of seal layer 208, adjacent dots and the like can be prevented from being affected by the laterally-emitted light.

Embodiment 4

Figure 10:
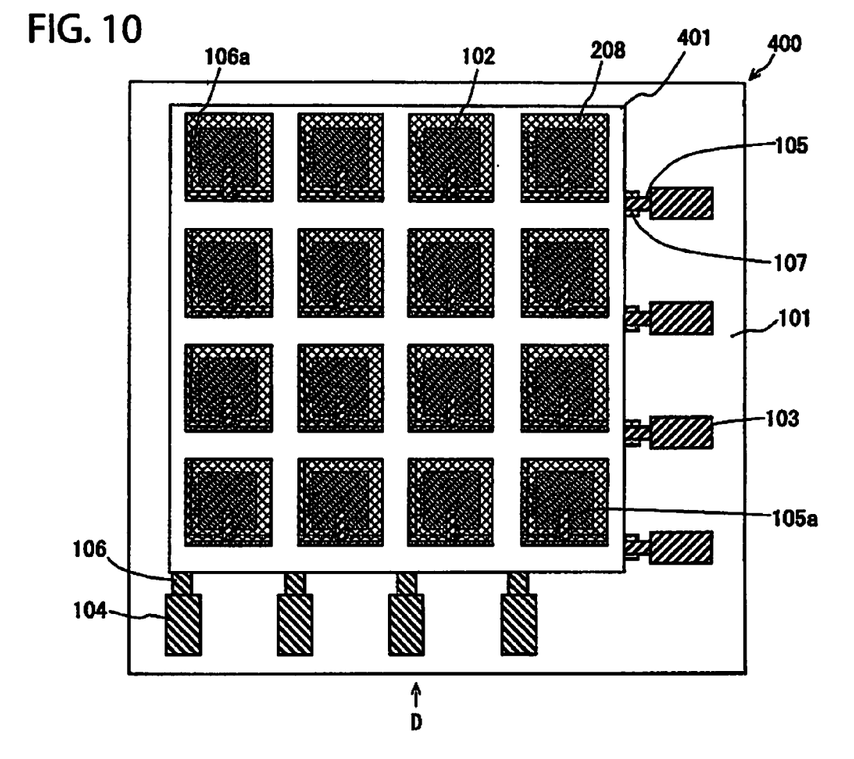
FIG. 10 is a plan view showing the configuration of a main part of a light-emitting device according to Embodiment 4 of the invention.
Figure 11:
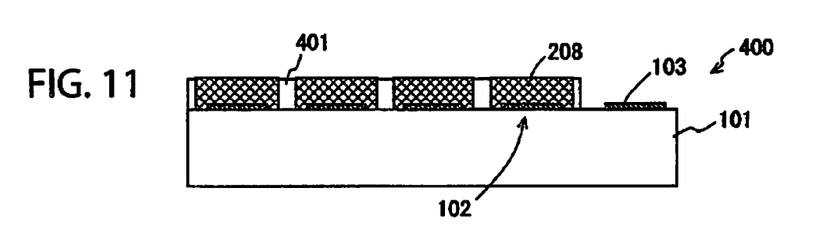
FIG. 11 is a side view schematically showing the main part of the light-emitting device according to Embodiment 4 in the direction of arrow D in FIG. 10.

FIG. 10 is a plan view showing the configuration of a main part of light-emitting device 400 according to Embodiment 4 of the invention, and FIG. 11 is a side view schematically showing the main part in the direction of arrow D in FIG. 10.

The main difference between light-emitting device 400 and light-emitting device 200 of Embodiment 2 shown in FIG. 6 is that white resist 401 is provided in spaces between adjacent ones of seal layers 208. Accordingly, portions which are common between light-emitting device 400 and light-emitting device 200 of Embodiment 2 (FIG. 6) are denoted by the same reference numerals, or are neither shown in the drawings nor described herein, in order to focus on the difference between them.

In this embodiment, as shown in FIGS. 10 and 11, white resist 401 is formed around seal layers 208 and in the spaces between seal layers 208 formed away from each other. For example, white resist 401 is formed as follows. First, by spin coating, screen printing, dispensing, or the like, the spaces are filled with a resin in which rutile-type titanium dioxide, zirconium oxide, magnesium oxide, asbestos, zinc oxide, or the like is dispersed in an epoxy resin, an acrylic resin, an olefin resin, or the like. Then, through a photolithography process, the resin is patterned to form a pattern in which the spaces between seal layers 208 are filled, as shown in FIGS. 10 and 11. Then, light-emitting device 400 thus sealed is cured by a thermal treatment.

According to light-emitting device 400 having the above configuration, light generated by each LED 102 and emitted through the side surface of seal layer 208 is reflected by white resist 401 to seal layer 208. Consequently, light emitted laterally or in other directions is reflected and led to the upper surface of seal layer 208, and is emitted through the upper surface of the seal layer 208.

As described above, in addition to the effects (1) to (9) obtained by Embodiment 2, light-emitting device 400 of this embodiment can offer the following effect: (11) light can be emitted efficiently because light emitted through the side surface of seal layer 208 is reflected to the inside of seal layer 208 and is then emitted through the upper surface thereof.

Embodiment 5

Figure 12:
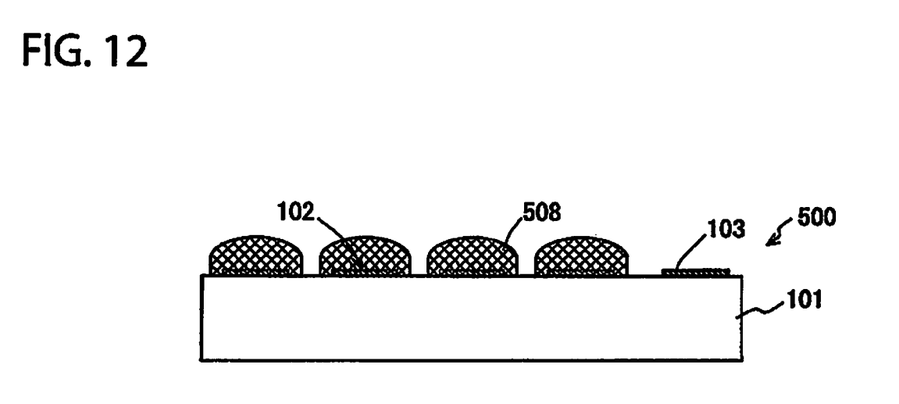
FIG. 12 is a side view schematically showing the configuration of a main part of a light-emitting device according to Embodiment 5 of the invention.

FIG. 12 is a side view schematically showing the configuration of a main part of light-emitting device 500 according to Embodiment 5 of the invention.

The main difference between light-emitting device 500 shown in FIG. 12 and light-emitting device 200 of Embodiment 2 shown in FIGS. 6 and 7 is the shape of each seal layer 508. Accordingly, portions which are common between light-emitting device 500 and light-emitting device 200 of Embodiment 2 (FIG. 6) are denoted by the same reference numerals, or are neither shown in the drawing nor described herein, in order to focus on the difference between them.

In this embodiment, seal layer 508 is formed separately for each LED 102, and as shown in FIG. 12, the upper surface of each seal layer 508 is formed into a curved surface having a predetermined curvature to offer a lens effect. Thereby, light generated by LED 102 is converged by seal layer 508, and is emitted to the air.

As described above, in addition to the effects (1) to (9) obtained by Embodiment 2, light-emitting device 500 of this embodiment can offer the following effect: (12) light emitted by LED 102 can be converged by seal layer 508.

Embodiment 6

Figure 13:
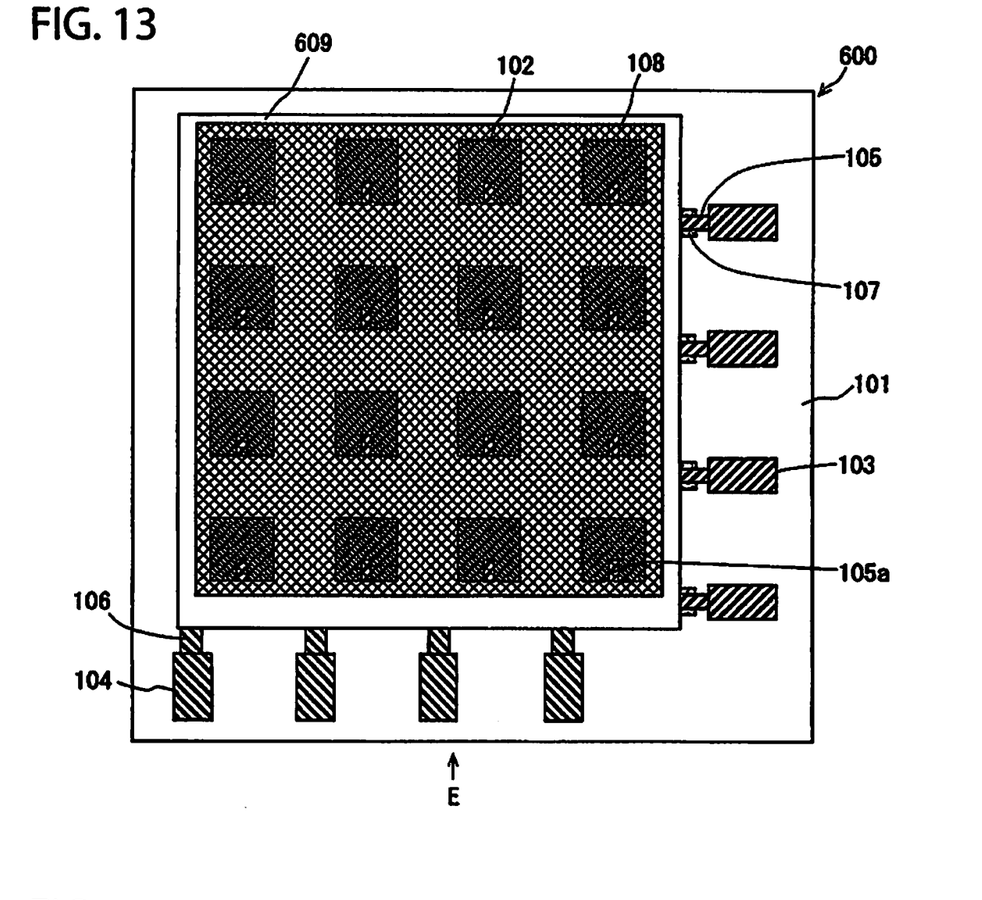
FIG. 13 is a plan view showing the configuration of a main part of a light-emitting device according to Embodiment 6 of the invention.
Figure 14:
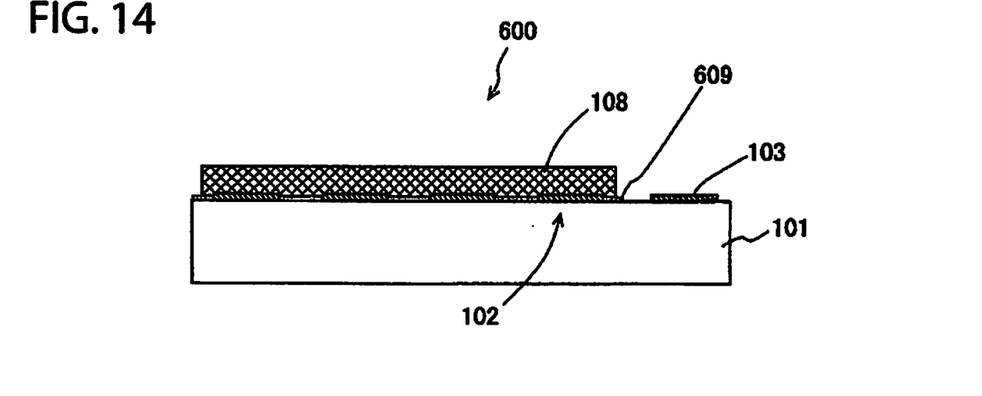
FIG. 14 is a side view schematically showing the main part of the light-emitting device according to Embodiment 6 in the direction of arrow E in FIG. 13.

FIG. 13 is a plan view showing the configuration of a main part of light-emitting device 600 according to Embodiment 6 of the invention, and FIG. 14 is a side view schematically showing the main part in the direction of arrow E in FIG. 13.

The main difference between light-emitting device 600 and light-emitting device 100 of Embodiment 1 shown in FIG. 1 is the addition of reflection film 609. Accordingly, portions which are common between light-emitting device 600 and light-emitting device 100 of Embodiment 1 (FIG. 1) are denoted by the same reference numerals, or are neither shown in the drawings nor described herein, in order to focus on the difference between them.

For example, reflection film 609 can be formed of a metal, such as Au, Ag, or Ti, or a white resist made of a resin in which rutile-type titanium dioxide, zirconium oxide, magnesium oxide, asbestos, zinc oxide, or the like is dispersed in an epoxy resin, an acrylic resin, an olefin resin, or the like. Reflection film 609 may be formed either on or below passivation film 907 (see FIG. 2). Reflection film 609 may be formed on the entire upper surface of light-emitting device 600, except for the areas having anode pads 103 and cathode pads 104 and the upper surfaces of LEDs 102, or only on portions surrounding LEDs 102.

The step of forming seal layer 108 is the same as that described in Embodiment 1 with reference to the flowchart shown in FIG. 3, and is therefore not described here.

Since light emitted through the side surface of LED 102 is emitted in every direction, part of the light is directed to substrate 101. According to light-emitting device 600 having the above configuration, light directed to substrate 101 is reflected by reflection film 609 formed surrounding LED 102, is led to the upper surface of seal layer 108, and is emitted through the upper surface of seal layer 108.

In the sectional view of FIG. 2, passivation film 907 is formed at a level, with reference to substrate 101, close to or higher than active layer 905 which is a light-emission portion of LED 102. This is because this section has contact terminal 105a or 106a. In other portions, passivation film 907 is formed at a position lower than active layer 905. Therefore, reflection film 609 is also formed at a position lower than active layer 905, except for part of portions surrounding LEDs 102. For this reason, the reflection effect described above can be achieved.

Although reflection film 609 is formed on or below passivation film 907 and on areas excluding the upper surfaces of LEDs 102 herein, the invention is not limited to this. For example, reflection film 609 may be formed on flattening insulation film 901 shown in FIG. 2 so that LEDs 102 are placed on reflection film 609.

As described above, in addition to the effects (1) to (5) obtained by Embodiment 1, light-emitting device 600 of this embodiment can offer the following effect: (13) light can be emitted efficiently because light emitted from LED 102 to substrate 101 is reflected by reflection film 609 and is emitted through the upper surface of seal layer 108.

Embodiment 7

Figure 15:
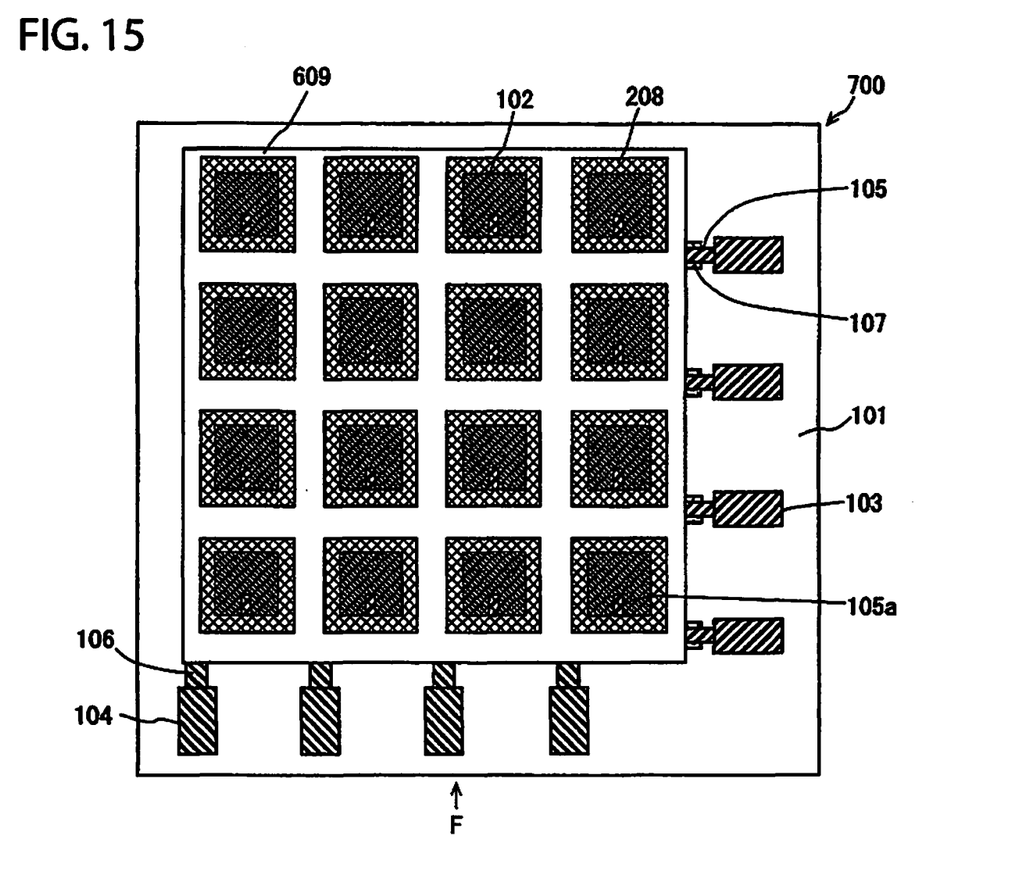
FIG. 15 is a plan view showing the configuration of a main part of a light-emitting device according to Embodiment 7 of the invention.
Figure 16:
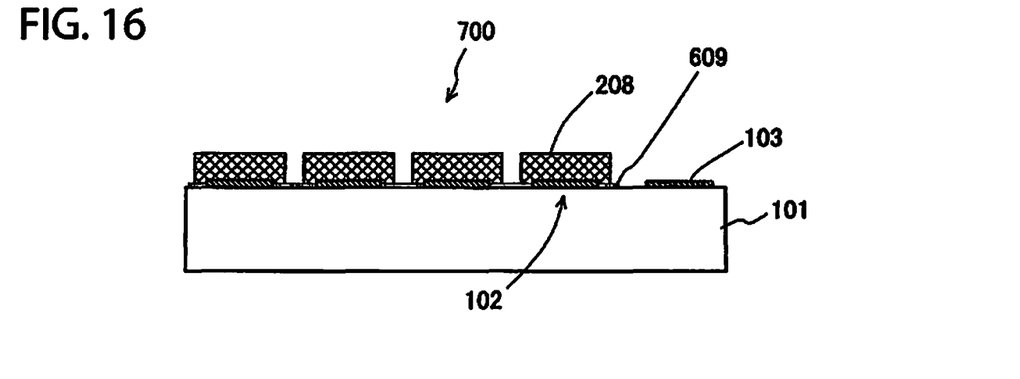
FIG. 16 is a side view schematically showing the main part of the light-emitting device according to Embodiment 7 in the direction of arrow F in FIG. 15.

FIG. 15 is a plan view showing the configuration of a main part of light-emitting device 700 according to Embodiment 7 of the invention, and FIG. 16 is a side view schematically showing the main part in the direction of arrow F in FIG. 15.

The main difference between light-emitting device 700 and light-emitting device 200 of Embodiment 2 shown in FIG. 6 is the addition of reflection film 609. Accordingly, portions which are common between light-emitting device 700 and light-emitting device 200 of Embodiment 2 (FIG. 6) are denoted by the same reference numerals, or are neither shown in the drawings nor described herein, in order to focus on the difference between them.

For example, reflection film 609 can be formed of a metal, such as Au, Ag, or Ti, or a white resist made of a resin in which rutile-type titanium dioxide, zirconium oxide, magnesium oxide, asbestos, zinc oxide, or the like is dispersed in an epoxy resin, an acrylic resin, an olefin resin, or the like. Reflection film 609 may be formed either on or below passivation film 907 (see FIG. 2). Reflection film 609 may be formed on the entire upper surface of light-emitting device 600, except for the areas having anode pads 103 and cathode pads 104 and the upper surfaces of LEDs 102, or only on portions surrounding LEDs 102.

The step of forming seal layer 208 is the same as that described in Embodiment 2, and is therefore not described here.

Since light emitted through the side surface of LED 102 is emitted in every direction, part of the light is directed to substrate 101. According to light-emitting device 700 having the above configuration, light directed to substrate 101 is reflected by reflection film 609 formed surrounding LEDs 102, is led to the upper surface of seal layer 208, and is emitted through the upper surface of seal layer 208.

In the sectional view of FIG. 2, passivation film 907 is formed at a level, with reference to substrate 101, close to or higher than active layer 905 which is a light-emission portion of LED 102. This is because this section has contact terminal 105a or 106a. In other portions, passivation film 907 is formed at a position lower than active layer 905. Therefore, reflection film 609 is also formed at a position lower than active layer 905, except for part of portions surrounding LEDs 102. For this reason, the reflection effect described above can be achieved.

Although reflection film 609 is formed on or below passivation film 907 and on areas excluding the upper surfaces of LEDs 102 herein, the invention is not limited to this. For example, reflection film 609 may be formed on flattening insulation film 901 shown in FIG. 2 so that LEDs 102 are placed on reflection film 609.

As described above, in addition to the effects (1) to (9) obtained by Embodiment 2, light-emitting device 700 of this embodiment can offer the following effect: (14) light can be emitted efficiently because light emitted from LEDs 102 to substrate 101 is reflected by reflection films 609 and is emitted through the upper surface of seal layer 208.

Figure 17:
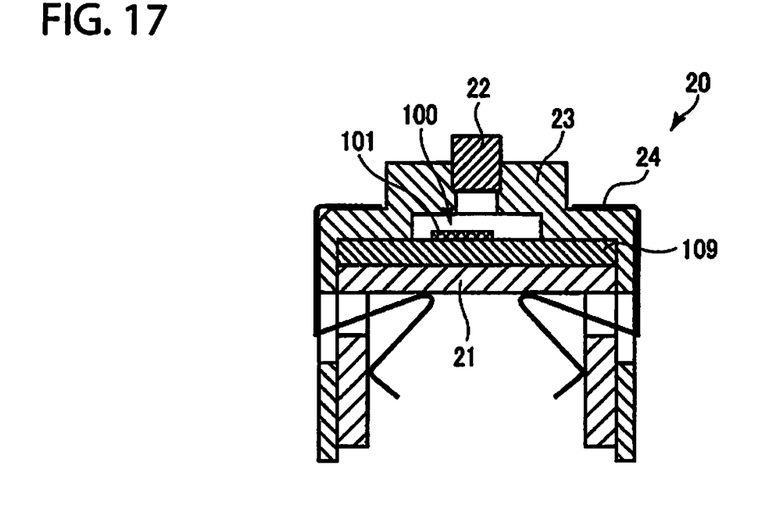
FIG. 17 is a sectional view of a print head having the light-emitting device of any of Embodiments 1 to 7.

FIG. 17 is a sectional view showing an example of print head 20, of an image formation apparatus, to which light-emitting device 100 of any of Embodiments 1 to 7 described above is applied.

In FIG. 17, print head (LED array head) 20 (the exposure device) is configured by placing light-emitting device 100 of any of Embodiments 1 to 3 on base member 21. Light-emitting elements (LEDs 102) of light-emitting device 100 are arranged one-dimensionally (in either of the row direction X or the column direction Y in FIG. 1).

Rod lens array 22 is arranged above light-emitting device 100, as an optical element configured to condense light emitted from the light-emitting elements (LEDs 102). In rod lens array 22, multiple optical lens elements are arranged in the same direction as the arrangement direction of the light-emitting elements. Rod lens array 22 is held at a predetermined position by lens holder 23 which is an optical element holder.

Lens holder 23 is formed in such a manner as to surround base member 21 and light-emitting device 100. Base member 21, light-emitting device 100, and lens holder 23 are integrally held by clamper 24.

Light emitted by light-emitting device 100 passes through rod lens array 22, is applied to the surface of photoconductive drum 41 (serving as the image carrier) to be described later, and is used for formation of an electrostatic latent image.

Figure 18:
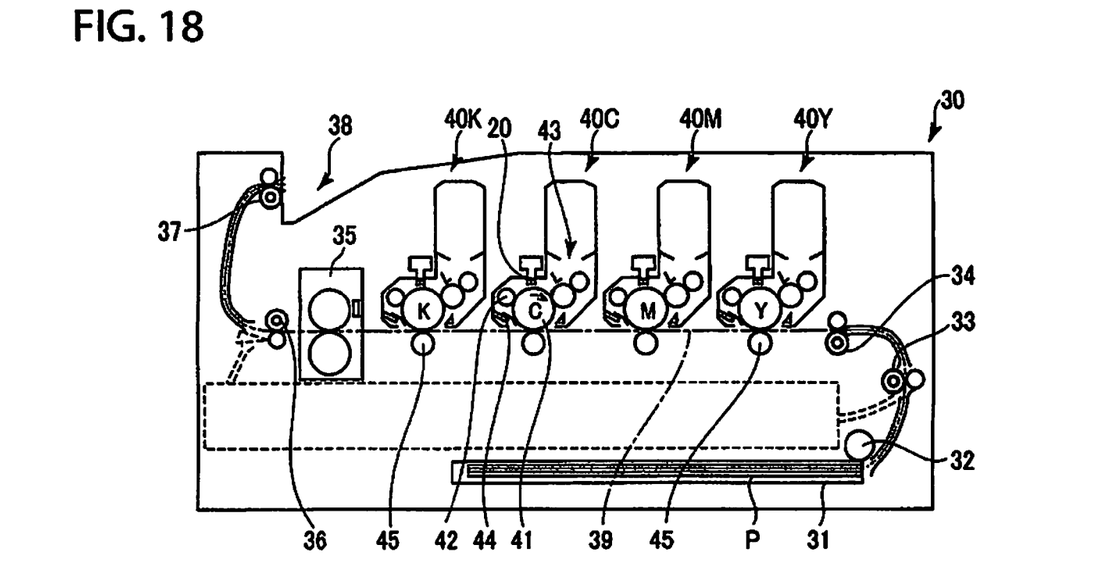
FIG. 18 is a diagram showing the configuration of an image formation apparatus having the print head in FIG. 17.

FIG. 18 is a diagram showing a configuration example of image formation apparatus 30 having print heads 20 shown in FIG. 17.

Image formation apparatus 30 is, for example, a color electrophotographic printer, and has process units 40Y, 40M, 40C, and 40K configured to form images of yellow, magenta, cyan, and black, respectively. Process units 40Y, 40M, 40C, and 40K are arranged along transportation path 39 of medium P such as printing paper. Having the same configuration, process units 40Y, 40M, 40C, and 40K are described using process unit 40C for cyan as an example.

Process unit 40C has photoconductive drum 41 (the image carrier) rotatable clockwise in the drawing. Components arranged around photoconductive drum 41 are, in its rotational direction, charge device 42 configured to evenly charge the surface of photoconductive drum 41, print head (exposure device) 20 configured to form an electrostatic latent image by selectively applying light to the surface of photoconductive drum 41, development device 43 configured to develop the electrostatic latent image formed on the surface of photoconductive drum 41 with toner of a predetermined color (cyan), and cleaner device 44 configured to remove toner remaining on the surface of photoconductive drum 41.

Media cassette 31 configured to house medium P is attached to a lower part of image formation apparatus 30. Feed roller 32 configured to pick up and feed medium P housed in media cassette 31 one at a time is located above media cassette 31. Further, there are paired feed rollers 33 and 34 configured to feed medium P to process units 40Y, 40M, 40C, and 40K in transportation direction 39 of medium P fed by feed roller 32.

Transfer rollers 45 (the transfer device) are located at positions opposing photoconductive drums 41 of process units 40Y, 40M, 40C, and 40K, respectively. To transfer a toner image formed on photoconductive drum 41 to medium P, the surface of photoconductive drum 41 and the surface of transfer roller 45 are given a predetermined difference in electric potential.

Fixation device 35 is located downstream of process units 40Y, 40M, 40C, and 40K along transportation path 39. Fixation device 35 has a heat roller and a backup roller, and fixes the toner transferred onto medium P by pressurizing and heating. Paired ejection rollers 36 and 37 are located downstream of fixation device 35 so as to feed medium P ejected from fixation device 35 to stacker part 38 provided in an exterior portion of image formation apparatus 30.

Next, an operation of image formation apparatus 30 is described. First, medium P housed in medium cassette 31 is picked up and fed to transportation path 39 by feed roller 32 one at a time. Medium P fed to transportation path 39 is fed to a nip portion between photoconductive drum 41 and transfer roller 45 of process unit 40Y by paired feed rollers 33 and 34.

In process unit 40Y, charge device 42 evenly charges the surface of photoconductive drum 41. Further, the light-emitting elements (LEDs 102) of print head 20 (see FIG. 17) emit light according to image information to thereby expose the surface of photoconductive drum 41 to light. Thus, an electrostatic latent image is formed on the surface of photoconductive drum 41. The electrostatic latent image formed on photoconductive drum 41 is developed into a toner image by development device 43. The toner image on the surface of photoconductive drum 41 is transferred to medium P when medium P passes through the nip portion between photoconductive drum 41 and transfer roller 45.

Medium P passes through process units 40M, 40C, and 40K in the same manner, so that toner images on photoconductive drums 41 are sequentially transferred to the surface of medium P.

Medium onto which the toner images have been transferred is fed to fixation device 35 where the toner images are fixed to medium P by heat and pressure. Medium P onto which the toner images have been fixed is ejected to stacker part 38 by paired ejection rollers 36 and 37. In this way, a color image is formed on medium P.

It is needless to say that the light-emitting device of each of the above embodiments is also applicable to an image formation apparatus other than the color electrophotographic printer described above.

Although LEDs are used as light-emitting elements in the above embodiments, the invention is not limited to this. For example, electroluminescence (EL) elements formed of an organic material or EL elements formed of an inorganic material may be used instead. Further, the light-emitting elements may be packaged in a flip-chip configuration.

Although only one LED is connected to a pair of anode wire and cathode wire as a light-emitting element in the above embodiments, the invention is not limited to this. Multiple LEDs may be connected in series.

Although the seal layer is formed for each LED in Embodiments 2 to 5 and 7 above, the invention is not limited to this. Multiple LEDs may be collectively covered with a single seal layer.

Further, although the seal layer is formed into a quadrangle in a plan view in Embodiments 2 to 5 and 7 above, the invention is not limited to this. For example, the seal layer may be formed into a circular form.

Although the seal layer is formed using a dry film resist made of an epoxy resin in the above embodiments, the invention is not limited to this. For example, the dry film resist may be made of an amide-imide resin, a silicone resin, an acrylic resin, or the like, instead of the epoxy resin.

Although the reflection film is formed as a single layer to cover all the light-emitting elements in Embodiments 6 and 7, the invention is not limited to this. The reflection film may be formed separately for each light-emitting element.

Although the space around the seal layers and the spaces between the seal layers are blank in Embodiment 6, these blank spaces may be filled with a black resist or a white resist as in Embodiments 3 and 4. In this way, various forms are applicable.

In addition, although terms such as "on" and "below" are used in the claims and the detailed description of embodiments above, this is for convenience only, and is not to limit the absolute positional relations in the light-emitting device installed.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

The invention claimed is:

1. A light-emitting device comprising:
a substrate;
a plurality of light-emitting elements formed on the substrate;
a seal member sealing the light-emitting elements, the seal member formed of a transparent dry film resist laminated on the substrate with the light-emitting elements interposed therebetween, the seal member being divided into multiple pieces that are separated from each other such that each piece seals one or more of the light-emitting elements,
wherein an entirety of an upper surface of the seal member is curved having a predetermined curvature, and
wherein a space between the pieces of the seal member is filled with a black resist to absorb light exiting from one of the light emitting elements from entering to another of the light emitting elements.

2. The light-emitting device according to claim 1, wherein the seal member of the dry film resist has at least one side edge that is eluted.

3. The light-emitting device according to claim 1, wherein the light-emitting elements are arranged in a grid.

4. The light-emitting device according to claim 1, wherein a reflection film configured to reflect upwardly light emitted by the light-emitting elements is formed surrounding the light-emitting elements.

5. The light-emitting device according to claim 1, wherein the seal member is made of an amide-imide resin.

6. An image formation apparatus comprising an exposure device having the light-emitting device of claim 1.

7. An image formation apparatus comprising:
an image carrier;
an exposure device having the light-emitting device of claim 1, and configured to emit light to a surface of the image carrier to form an electrostatic latent image on the surface of the image carrier;
a development device configured to supply a developer to the electrostatic latent image on the surface of the image carrier to form a developer image on the surface of the image carrier;
a transfer device configured to transfer the developer image formed on the surface of the image carrier onto a medium; and
a fixation device configured to fix the transferred developer image to the medium.

8. A method of manufacturing a light-emitting device, the method comprising:

laminating a dry film resist on a substrate on which a plurality of light-emitting elements are formed, with the light-emitting elements interposed between the dry film resist and the substrate;

placing a photomask on the laminated dry film resist;

exposing to light an area of the dry film resist excluding an unexposed portion of the dry film resist covered with the photomask;

forming a pattern of a seal layer made of dry film resist sealing the light emitting elements, by eluting the unexposed portion covered with the photomask;

forming an upper surface of the seal layer such that an entirety of the upper surface of the seal layer is curved with a predetermined curvature; and filling a space between the pieces of the seal layer with a black resist to absorb light exiting from one of the light emitting elements from entering to another of the light emitting elements.

* * * * *